United States Patent
Li et al.

(10) Patent No.: US 11,075,317 B2
(45) Date of Patent: Jul. 27, 2021

(54) SMOOTHED DOPED LAYER FOR SOLAR CELL

(71) Applicants: IMEC vzw, Leuven (BE); Katholieke Universiteit Leuven, Leuven (BE)

(72) Inventors: Yuandong Li, Leuven (BE); Filip Duerinckx, Kessel-Lo (BE); Maria Jesus Recaman Payo, Attenrode (BE); Jef Poortmans, Kessel-Lo (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 16/714,477

(22) Filed: Dec. 13, 2019

(65) Prior Publication Data
US 2020/0203553 A1    Jun. 25, 2020

(30) Foreign Application Priority Data
Dec. 20, 2018 (EP) .................................... 18214806

(51) Int. Cl.
*H01L 31/0236* (2006.01)
*H01L 31/18* (2006.01)
(Continued)

(52) U.S. Cl.
CPC ...... *H01L 31/1868* (2013.01); *H01L 21/0243* (2013.01); *H01L 21/02634* (2013.01);
(Continued)

(58) Field of Classification Search
None
See application file for complete search history.

(56) References Cited

U.S. PATENT DOCUMENTS

2003/0111106 A1* 6/2003 Nagano ............... H01L 31/0687
136/255
2013/0288418 A1 10/2013 Wang et al.
(Continued)

FOREIGN PATENT DOCUMENTS

| EP | 1 973 167 A2 | 9/2008 |
| EP | 1 973 167 A3 | 5/2011 |
| EP | 2 479 797 A1 | 7/2012 |

OTHER PUBLICATIONS

Extended European Search Report dated Mar. 8, 2019 for European Patent Application No. 18214806.4 in 9 pages.
(Continued)

*Primary Examiner* — Benjamin P Sandvik
(74) *Attorney, Agent, or Firm* — Knobbe, Martens, Olson & Bear, LLP

(57) ABSTRACT

The disclosed technology generally relates to silicon solar cells and more particularly to a doped layer formed on a textured surface of a silicon solar cell, and methods of fabricating the same. In one aspect, a method of creating a doped layer at a rear side of a crystalline silicon bifacial solar cell is disclosed. The method can include texturing at least a rear side of a silicon substrate of the solar cell to create a pattern of pyramids, thereby creating a pyramidal topology of the rear side. The method can also include forming a doped layer at the rear side by, using epitaxial growth, growing at least one doped silicon epitaxial layer on the pyramids. Simultaneously with forming the doped layer and by using facet evolution, the pyramidal topology of the rear side can be smoothed by the growth of the at least one epitaxial layer. The epitaxial growth can be continued until, on upper parts of a majority of the pyramids, an angle
(Continued)

between a surface of the at least one epitaxial layer and the substrate is between 5 to 35°. A crystalline silicon bifacial solar cell is also disclosed.

20 Claims, 2 Drawing Sheets

(51) Int. Cl.
  *H01L 31/048* (2014.01)
  *H01L 21/02* (2006.01)
  *H01L 21/203* (2006.01)

(52) U.S. Cl.
  CPC .... *H01L 21/2033* (2013.01); *H01L 31/02363* (2013.01); *H01L 31/048* (2013.01); *H01L 31/1804* (2013.01); *H01L 31/1872* (2013.01)

(56) References Cited

U.S. PATENT DOCUMENTS

| | | | |
|---|---|---|---|
| 2018/0315866 A1 | 11/2018 | Cheong et al. | |
| 2018/0337292 A1* | 11/2018 | Lee | H01L 31/0747 |
| 2020/0028003 A1* | 1/2020 | Uto | H01L 31/0747 |

OTHER PUBLICATIONS

Cornagliotti et al., "How Much Rear Side Polishing is Required? A Study on the Impact of Rear Side Polishing in Perc Solar Cells", 27th European Photovoltaic Solar Energy Conference and Exhibition, pp. 561-566, 2012.

Duerinckx et al., "Optical Simulation of Bifacial Silicon Solar Cells at Module Level", 33rd European Photovoltaic Solar Energy Conference and Exhibition, pp. 884-888, 2017.

Horzel et al., "Development of Rear Side Polishing Adapted to Advanced Solar Cell Concepts", 26th European Photovoltaic Solar Energy Conference and Exhibition, pp. 2210-2216, 2011.

Kranz et al., "Wet chemical polishing for industrial type PERC solar cells", Energy Procedia 38 pp. 243-249, 2013.

Loubet et al., "High-density plane deposition kinetics and facet propagation in silicon-selective epitaxial growth", Semicond. Sci. Technol. 22, pp. S149-S152, 2007.

McIntosh et al., "Optical Evaluation of Silicon Wafers With Rounded Rear Pyramids", IEEE Journal of Photovoltaics, vol. 7, No. 6, pp. 1596-1602, Nov. 2017.

Moehlecke et al., Practical High Efficiency Bifacial Solar Cells, IEEE First World Conference on Photovoltaic Energy Conversion, pp. 1663-1666, Dec. 5-9, 1994.

Schwab et al., Recombination and Optical Properties of Wet Chemically Polished Thermal Oxide Passivated Si Surfaces, IEEE Journal of Photovoltaics, vol. 3, No. 2, pp. 613-620, Apr. 2013.

Zin et al., Rounded Rear Pyramidal Texture for High Efficiency Silicon Solar Cells, IEEE 43$^{rd}$ Photovoltaic Specialists Conference, pp. 2548-2553, 2016.

* cited by examiner

SMOOTHED DOPED LAYER FOR SOLAR CELL

CROSS-REFERENCE TO RELATED APPLICATIONS

This application claims foreign priority to European Patent Application No. EP 18214806.4, filed Dec. 20, 2018, the content of which is incorporated by reference herein in its entirety.

BACKGROUND

Field

The disclosed technology generally relates to silicon solar cells and more particularly to a doped layer formed on a textured surface of a silicon solar cell, and to methods of fabricating the same.

Description of the Related Technology

Pyramidal texturing of the front side of a silicon solar cell may improve a light trapping capability of the solar cell and may result in an increased light generated current density. In a bifacial solar cell, such a texturing of also the rear side may help to reduce reflection loses from rear illumination of the solar cell. In addition, such a texturing of also the rear side may help to further improve the light trapping capability of bifacial cells. However, such textured surfaces may be more difficult to passivate compared to their planar counterparts, especially due to the often sharp peaks of the pyramids, the increased surface area, and/or the higher density of interface states.

To overcome the above mentioned difficulty with passivation of a textured rear side, it has been attempted to smooth the pyramids using chemical polishing. The semi-textured surface, e.g., a surface morphology between planar and full pyramidal texture, has increased the passivation quality at the rear side of the solar cell in some instances. It has also been shown that a semi-textured rear surface may lead to an improved light trapping effect for bifacial solar cells. However, such a process relies on wet chemical treatment and may require one or more an additional processing steps.

It may also be required to form one or more junctions on the textured side after the smoothing has been completed. Using traditional diffusion or ion-implantation techniques, the resulting junctions may be shallow and require a higher doping level in order to ensure a good conductivity. Such a higher doping may in turn lead to higher Auger recombination losses during operation of the solar cell.

In light of the above, there is therefore a need for an improved way of texturing, passivating, and providing a junction on, e.g., the rear side of a bifacial solar cell.

SUMMARY OF CERTAIN INVENTIVE ASPECTS

To at least partly fulfill the above needs, the present disclosure seeks to provide an improved method of creating a doped layer of a solar cell, and a solar cell as such, as defined in the independent claims. Further embodiments of the method and solar cell are defined in the dependent claims.

According to a first aspect of the present disclosure, a method of creating a doped layer at a rear side of a crystalline silicon bifacial solar cell is provided. The method may include texturing at least a rear side of a silicon substrate of the solar cell to create a pattern of pyramids, thereby creating a pyramidal topology of the rear side. The pattern of pyramids may be random or non-planar, or the pattern of pyramids may be regular, depending on the exact technique used for the formation thereof. The method may further include forming a doped layer at the rear side by, using epitaxial growth, growing at least one doped silicon epitaxial layer on the pyramids. In the method, simultaneously with forming of the doped layer and by using facet evolution, the pyramidal topology of the rear side may be smoothed by the growth of the at least one epitaxial layer. The epitaxial growth may be continued until, on upper parts of a majority of the pyramids, an angle between a surface of the at least one epitaxial layer and the substrate is between 5 to 35°.

By forming the doped epitaxial layer directly on the pyramidal texture surface of the substrate, a junction (or doped layer) with a desired thickness may be formed simultaneously with smoothing of the pyramids in order to obtain proper passivation. Without the use of wet chemicals, the junction (doped layer) may be formed in a single step on the rear side of the solar cell. Such a junction or doped layer may have both sufficiently low doping to decrease the Auger recombination losses, and a large enough thickness to provide (and/or guarantee) sufficient electrical conductivity. In addition, emitter and surface recombination rates may also be reduced due to the rounding/smoothing of the pyramids and the light trapping for the bifacial solar cell may be improved. Furthermore, the implementation of a deep junction (e.g., emitter) may for example reduce shunt losses due to metal spikes.

By reducing the angle between the surface of the epitaxial layer and the substrate to between 5 to 35°, sufficient smoothing may be obtained to provide a high light trapping effect (e.g., an optimal light trapping effect in some instances) and therefore a high light generated current density (e.g., an optimal light generated current density in some instances) during operation of the solar cell.

In some embodiments, the epitaxial growth may be continued until the angle (between the surface of the epitaxial layer and the substrate, on the upper parts of the majority of the pyramids) is between 10 to 25°. In some embodiments, the angle may be 20° or 25°. Such reduction of the angle may provide a higher light generated current density (e.g., an even more optimal light generated current density in some instances). An angle of 20° may for example correspond to a theoretical optimum, while an angle of 25° may for example correspond to an optical angle which may be obtained in, e.g., silicon. It is, within the present disclosure, envisaged that other angles corresponding closer to the theoretical optimum of 20° may also be obtained if e.g., other material configurations are used instead or in addition to silicon.

In some embodiments, the epitaxial growth may be continued until a thickness of the at least one epitaxial layer is between 1 to 2 μm. In some embodiments, the epitaxial growth may be continued until the thickness is 1.3 μm.

In some embodiments, the epitaxial growth may be performed using a growth rate of between 5 and 4000 nm/min.

In some embodiments, the epitaxial growth may be performed using a temperature of between 700 and 1150° C.

In some embodiments, the epitaxial growth may be performed using $SiH_2Cl_2$ as a silicon precursor source, at a growth rate of between 5 to 500 nm/min, and at a temperature of between 700 to 1000° C.

In some embodiments, the epitaxial growth may be performed using SiHCl$_3$ as a silicon precursor source, at a growth rate of between 200 to 4000 nm/min, and at a temperature of between 900 to 1150° C.

In some embodiments, the epitaxial growth may be performed using SiH$_4$ as a silicon precursor source, at a growth rate of between 200-4000 nm/min, and at a temperature of between 900 to 1150° C.

Using e.g., SiH$_2$Cl$_2$, SiHCl$_3$ or SiH$_4$ as described above may for example allow for a "selective" deposition on, and a "selective" smoothing of, only one side (e.g., the rear side) of the bifacial solar cell.

In some embodiments, the epitaxial growth may be performed using B$_2$H$_6$, BCl$_3$, or PH$_3$ or AsH$_3$ as a dopant source. Using e.g., B$_2$H$_6$ or BCl$_3$ may create a p-type doped layer. Using e.g., PH$_3$ or AsH$_3$ may create an n-type doped layer.

In some embodiments, a gas flow ratio of dopant source to SiH$_2$Cl$_2$ may be between $10^{-5}$ to $10^{-2}$. The gas flow ratio may be measured by a gas flow controller.

In some embodiments, after the texturing, a pyramid angle of the pyramids may be at least 40°. As used herein, a "pyramid angle" may correspond to the angle between the extension plane of the substrate (e.g., a (100) face of the silicon) and the slope/sides of the pyramids (e.g., a (111) face). Herein, faces are defined using Miller indices.

According to a second aspect of the present disclosure, a crystalline silicon bifacial solar cell is provided. The solar cell may include a silicon substrate. The silicon substrate may have a front side and a rear side. At least the rear side may be patterned with pyramids. The solar cell may further include at least one doped smoothing layer of epitaxially grown silicon provided on the pyramids. A pyramid angle of the pyramids may be at least 40°. On upper parts of a majority of the pyramids, an angle between a surface of the at least one smoothing layer and the substrate may be between 5 to 35°. The pyramids may retain their pyramid angles of at least 40°, such as for example 54.7°, resulting from them being formed using e.g., anisotropic etching as described herein. The smoothing may instead be provided by the at least one smoothing layer, which may include a plurality of facets such that the angle between the surface of a facet and the substrate changes abruptly (e.g., discontinuously) when moving from one facet to a neighboring facet. This can be in contrast to a common device wherein the smoothing of the original pyramids has instead been performed using e.g., wet chemical etching, wherein no such facets are present and the surface of the pyramids is continuous without sudden jumps in the angle between the surface and the substrate.

In some embodiments, the angle between the surface of the at least one smoothing layer and the substrate may be between 10 to 25°. In some embodiments, this angle may be 20° or 25°. As explained herein, 20° may correspond to a theoretically optimum angle in terms of light trapping and/or passivation, while 25° may correspond e.g., to an optimal angle achievable in silicon.

In some embodiments, a thickness of the at least one smoothing layer may be between 1 to 2 μm. In some embodiments, this thickness may be 1.3 μm.

The present disclosure relates to all possible combinations of features mentioned herein, including the ones listed above as well as other features which will be described in what follows with reference to different embodiments. Any embodiment described herein may be combinable with other embodiments also described herein, and the present disclosure relates also to all such combinations. For example, all limitations specified herein with reference to the method according to the first aspect may apply also to (and/or be combinable with) the solar cell according to the second aspect, and vice versa. Further objects and advantages of the various embodiments of the present disclosure will be described below by means of exemplifying embodiments.

BRIEF DESCRIPTION OF THE DRAWINGS

Exemplifying embodiments will be described below with reference to the accompanying drawings, in which.

Figure 1A:
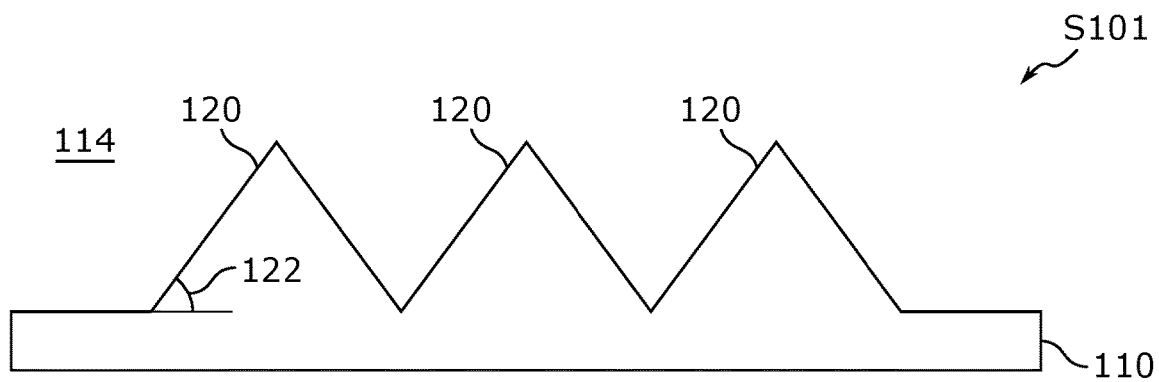
FIG. 1a schematically illustrates a step in an embodiment of a method according to the present disclosure.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION OF CERTAIN ILLUSTRATIVE EMBODIMENTS

Exemplifying embodiments of a method and a solar cell according to the present disclosure will now be described more fully hereinafter with reference to the accompanying drawings. The drawings show currently preferred embodiments, but the invention may, however, be embodied in many different forms and should not be construed as limited to the embodiments set forth herein; rather, these embodiments are provided for thoroughness and completeness, and fully convey the scope of the present disclosure to the skilled person.

With reference to FIGS. 1a-1e, various embodiments of a method of creating a doped layer at a rear side of a crystalline silicon bifacial solar cell will now be described in more detail.

FIG. 1a schematically illustrates a first step S101 in an embodiment of the method, wherein a silicon substrate 110 is provided with a pattern of pyramids 120. The pattern may, if formed using e.g., anisotropic etching, be random. It is envisaged also that other methods of formation may be used, such as nano-patterning using photolithography or nano-imprinting, and that the pattern may then be regular. The substrate 110 has a front side 112 and a rear side 114, and the pattern of pyramids 120 together forms a pyramidal topology of the rear side 114 of the substrate 110. The texturing of the rear side 114 of the substrate 110 may for example be achieved by anisotropic etching of the substrate 110 (e.g., it is envisaged that the substrate 110 can be originally thicker than illustrated in FIG. 1a, and that the pyramids 120 can be formed by anisotropic etching of the substrate 110). Such anisotropic etching may for example be obtained by immersing the substrate 110 in a chemical solution, for example a KOH-based solution, a NaOH-based solution, or a TMAH-based solution. Alternatively, the pyramids 120 may be formed by for example nano-patterning, using e.g., photolithography, dry etching and/or nano-imprinting for texturing.

Although illustrated as being flat in the embodiment shown in FIG. 1a, the front side 112 may in other embodiments instead be textured/non-planar, using for example a same technique used for forming the pattern of pyramids 120 on the rear side 114.

As illustrated in FIG. 1a, a pyramid angle 122 can be defined between the plane of extension of the substrate 110 and the slope of the side of the pyramids 120. In some implementations, this pyramid angle is at least 40°. It may be envisaged that the substrate 110 is a monocrystalline silicon substrate, and that the substrate is oriented such that its horizontal surface (as illustrated in FIG. 1a) is a (100) silicon surface/face. If using e.g., anisotropic etching to texture the substrate 110, the sides/slopes of the pyramids 120 may then be (111) planes/faces of the silicon, and the pyramid angle may be approximately 54.7°.

Although all pyramids 120 shown in FIG. 1a are identical in height, it is envisaged also that the pyramids 120 may not have identical height. The distribution of heights (and also the positions of individual pyramids on the substrate 110) may for example be random. It is, however, envisaged that the pyramid angle 122 may remain approximately the same for at least a majority, or in some embodiments all, of the pyramids 120.

When texturing the rear side 114 of the substrate 110, it is envisaged that also the front side 112 of the substrate 110 may be processed similarly, to also texture the front side 112 with a pattern of pyramids (not shown in FIG. 1a). Having pyramids also on the front side 112 of the surface may for example, in some instances, enhance light trapping within the substrate 110, and provide an increased efficiency of the solar cell of which the substrate 110 forms a part.

The silicon of the substrate 110 may be of a certain doping type (e.g., an n-type doping or a p-type doping).

Figure 1B:
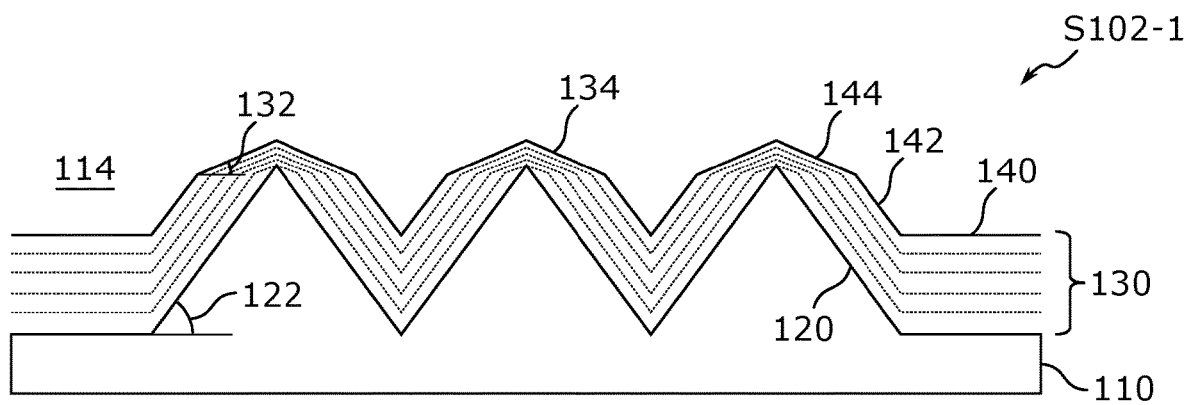
FIGS. 1b, 1c, 1d, and 1e each schematically illustrates alternative further steps in embodiments of the method according to the present disclosure.

FIG. 1b illustrates schematically a next step S102-1 of one embodiment of the method, wherein a doped layer is formed at the rear side 114 by the use of epitaxial growth to grow at least one silicon epitaxial layer 130 on the pyramids 120. Within the present disclosure, a silicon epitaxial layer such as the (at least one) layer 130 may for example have a same doping type as the substrate 110 but with a different doping concentration, and thereby form e.g., a p+/p or n+/n junction together with the substrate 110 (such as used to create e.g., a back side field, BSF, structure). In other embodiments, the silicon epitaxial layer 130 may for example have a different doping type than the substrate 110, and thereby form e.g., p/n or n/p junction together with the substrate 110 (such as used to create e.g., an emitter structure).

When growing the at least one epitaxial silicon layer 130, facet evolution may be present such that the at least one epitaxial layer 130 ends up having a plurality of facets with different angles. For example, a part 140 of the layer 130 may correspond to a (100) face of the silicon substrate 110 and pyramids 120, another part 142 of the layer 130 may correspond to a (111) face of the substrate 110 and pyramids 120, while a third part 144 of the layer 130 may correspond to a (311) face of the substrate 110 and pyramids 120. In the illustrated embodiment, evolving facets of at least some of the pyramids is such that the at least one epitaxial layer 130 forms at least one facet (e.g., the third part 144) having a crystallographic orientation that is different compared to facets of the pyramids prior to epitaxially growing the at least one epitaxial layer 130. Simultaneously with the formation of the doped layer 130, e.g., while growing the at least one layer 130 on top of the pyramids 120, the pyramidal topology of the rear side 114 may thus be smoothed. Phrased differently, smoothing of the pyramidal topology of the rear surface 114 may be obtained by reducing the slope of the pyramids at least on their tops. The epitaxial growth may continue until an angle between a surface 134 of the layer 130 and the substrate 110, as indicated by the angle 132, has been sufficiently reduced. This may apply to at least a majority of all pyramids 120 in some instances. As used herein, the angle 132 may refer to the angle between the surface 134 of the layer 130 in an upper part of the respective pyramid and the plane of extension of the substrate 110. In FIG. 1a, this may correspond to the angle between the surface of the layer 130 growing/forming a facet on the (311) face 144 of the silicon substrate 110/pyramids 120.

During the growth of the epitaxial layer 130, the facets of the pyramidal topology of the rear side 114 may change. New (311) facets may start growing from the top of the pyramids 120 and form a cap-like structure on top of the existing (111) faces of the pyramids 120. By ending the epitaxial growth at this stage, after the (combined) thickness of the at least one layer 130 has reached approximately 1.3 µm, the angle 132 may be approximately 25° in some instances. Phrased differently, the epitaxial conditions may be adapted such that silicon has a lower growth rate on the (311) face than on the (111) face. The (311) face (or plane) may have a tilted angle of 25° (or more exactly 25.2°) with respect to the (100) face, while the (111) face may have an angle of 54.7° with respect to the (100) face in some instances. For example, the face with the lowest growth may dominate the surface morphology at the pyramid tips, and result in a smoothed pyramidal topology where the angle 132 is approximately 25°. As used within the present disclosure, an angle of X° may be construed as meaning approximately X°, including e.g., angles lying within the interval X°+/−1° or X°+/−0.5°. For example, the angle of 25.2° between the (311) and (111) faces of silicon may be considered to be included in the meaning "25°".

For example, the epitaxial growth process used to create the smoothing as seen in FIG. 1b may be configured/adjusted such that the growth rates for the different faces correspond to a first set of growth rates. This first set of growth rates may include that the growth rates of the (111) face and the (311) face are e.g., approximately 0.6 and 0.27, respectively, when normalized with respect to the growth rate for the (100) face. If ending the growth once the (complete) thickness of the epitaxial layer 130 may be, e.g., 1.3 µm, these ratios may give rise to the structure seen in FIG. 1b. In the present disclosure, when referring to various (normalized) growth rates, it is envisaged that the numbers given may be accurate within an interval of e.g., +/−10-15%.

Figure 1C:
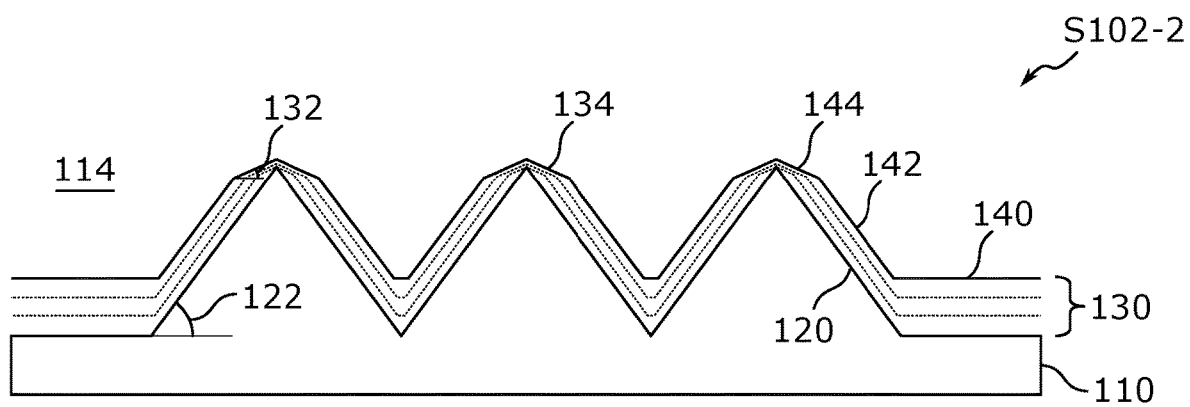

FIG. 1c illustrates schematically a different, alternative step S102-2 in an another embodiment of the method, compared to the embodiment shown in and described with reference to FIG. 1b. In the step S102-2, the epitaxial growth process has instead been configured/adjusted such that the growth rates of the different silicon faces correspond to a second set of growth rates. This second set of growth rates may include that the growth rates of the (111) and (311) faces, when normalized to the growth rate of the (100) face, are approximately e.g., 0.48 and 0.18, respectively. In FIG. 1c, the complete thickness of the epitaxial layer 130 can still be 1.3 µm, but it may be seen that the slower normalized growth rates of the (111) and (311) faces in the second set (compared with the first set) results in there still being e.g., (100) faces of the epitaxial layer 130 remaining e.g., between the pyramids 120. The pyramid angle 122 and the angle 132 between the surface 134 of the epitaxial layer 130 and the substrate (e.g., the (100) face) at the top of the pyramids 120 however may remain the same as those described with reference to FIG. 1b.

Figure 1D:
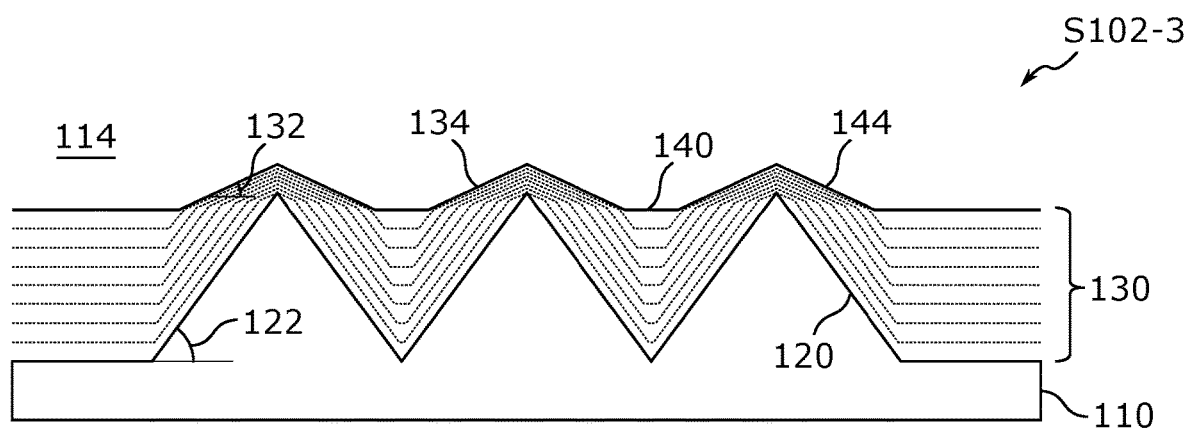

FIG. 1d illustrates schematically yet another different, alternative step S102-3 in an alternative embodiment of the method. The epitaxial growth process can here be the same as that described with reference to FIG. 1c (e.g., using the second set of growth rates), but the epitaxial growth can be continued until the (complete) thickness of the epitaxial layer 130 is approximately e.g., 3 µm. The angles 122 and 132 can remain the same, but it may be seen that there no longer remains any (111) face on the surface 134 of the epitaxial layer 130 in some instances.

Figure 1E:
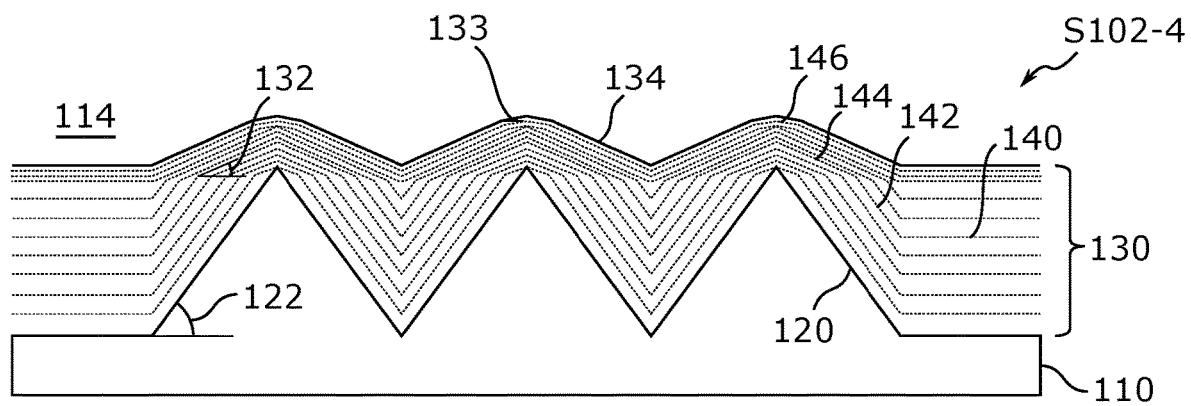

FIG. 1e illustrates schematically yet another different, alternative step S102-4 in an alternative embodiment of the method. The epitaxial growth process can here be the same as that described with reference to FIG. 1b (e.g., using the first set of growth rates), but the epitaxial growth can be continued until the (complete) thickness of the epitaxial layer 130 is approximately e.g., 3 µm. The angles 122 and 132 can remain the same, but it may be seen that an additional face 146, for example a (911) face, having an angle 133 of approximately e.g., 9° (or 8.93°) also forms as an additional face of the layer 130 in some instances. The normalized growth ratios (with respect to the (100) face) for such a 911 face may, using the first set of parameters, be for example 0.27.

In general, the at least one epitaxial layer may have several facets, where the slope angle of a facet with respect to the substrate changes abruptly when moving from one facet to a neighboring facet in some instances. This can be illustrated e.g., in the examples of embodiments provided with reference to FIGS. 1a-1e. Although the examples provide examples of specific faces, such as the (111), (311) and (911) with respect to the (100) face, it is envisaged of course also that other faces, such as e.g., a (1211, twelve-one-one) face may be present in addition, or as alternatives, as long as the angles at the top of the pyramids belong to the desired intervals as specified herein with regards to increased light trapping (e.g., optimal light trapping in some instances). A (1211) face may for example correspond to an angle of approximately 7° (or 6.72°) in some instances.

In some embodiments, the epitaxial growth process may include for example a temperature between 700-1000° C., a pressure between 10-1000 Torr, a growth rate between 5-500 nm/min, $SiH_2Cl_2$ as a silicon source, and $B_2H_6$ as a dopant source. A gas flow ratio (as measured e.g., by a gas flow controller) of dopant source to silicon source may for example be between $10^{-5}$ to $10^{-2}$, while a gas flow ratio of carrier gas to silicon source may for example be between 200 to 500. It may here be envisaged that, in some instances, when discussing gas flow ratios, a concentration of the precursors is normalized to 100%.

It is also envisaged that, in other embodiments, the silicon source may be $SiHCl_3$ or $SiH_4$, the temperature range 900-1150° C., and the growth rate range 200-4000 nm/min.

Dopant sources may include for example $B_2H_6$ and $BCl_3$, which may create a p-type epitaxial layer. Other dopant sources envisaged includes for example $PH_3$ and $AsH_3$, which may create an n-type epitaxial layer.

At for example, a temperature of 950° C., the growth rate ratios may correspond to those in the first set of growth rates. At a lower temperature of 850° C., the growth rate ratios may correspond to those in the second set of growth rates, as described above.

The epitaxial growth of the (at least one) epitaxial layer may be performed only at the rear side of the substrate and not at the front side in some implementations. The front side may e.g., then retain its original pyramidal topography for light trapping purposes. Such a "selective" epitaxial deposition (with respect to the front/rear side of the substrate) may be obtained using process conditions which are selected to avoid parasitic deposition on the front side, e.g., by avoiding the use of $SiH_4$ as a silicon precursor. Instead, using e.g., $SiH_2Cl_2$ or $SiHCl_3$ as silicon precursors (as described earlier herein) may allow for such selective epitaxial growth/deposition.

In addition to a desired thickness of the epitaxial layer, the present disclosure can suggest also to design the doping level of the doped layer in accordance with the sheet resistance value, as it may be desired for the solar cell device. The optical gain provided by the method of the present disclosure may be valid for various device structures, including e.g., nPERT (n-type passivated emitter, rear totally diffused) p+ rear emitter structures, pPERT (p-type passivated emitter, rear totally diffused) p+ rear back surface field (BSF) structures, and nPERT n+ BSF structures. For example, in an nPERT p+ rear emitter structure, the thickness of the epitaxial layer may be between 1-3 µm, a sheet resistance may correspond to 50-250 Ω/sq and a (Boron) doping level range may correspond to $2·10^{17}$-$2·10^{19}$ $cm^{-3}$. For a pPERT p+ BSF structure (or an nPERT n+ BSF structure), the thickness of the epitaxial layer may be between 1-3 µm, a sheet resistance may correspond to 50-350 Ω/sq and a (Boron) doping level range may correspond to $2·10^{17}$-$2·10^{19}$ $cm^{-3}$.

As described earlier herein, the present disclosure also provides a crystalline silicon bifacial solar cell. The solar cell may correspond to e.g., one of the structures shown in and described with reference to any of FIGS. 1b-1c. For example, the solar cell may include a silicon substrate 110 having a front side 112 and a rear side 114. The rear side 114 may be patterned with pyramids 120, and at least one smoothing layer 130 of epitaxially grown silicon may be provided on the pyramids 120. A pyramid angle 122 of the pyramids 120 may be at least 40° (such as for example 54.7°). On upper parts of a majority of the pyramids 120, an angle 132 between a surface 134 of the at least one smoothing layer 130 and the substrate 110 may be between 5 to 35°. In some embodiments, the angle 132 may be between 10 to 25°, e.g., 20°. A solar cell according to the present disclosure may be identified by the presence of sharp transitions between different facets, e.g., sharp transitions between different angles, of the epitaxial smoothing layer. In contrast, a common solar cell wherein smoothing of the pyramidal topology has been obtained by e.g., wet chemical processing may instead be identified by there, instead, being a smooth transition between different angles and no distinct facets. Although other elements used to form a complete solar cell are not illustrated in the Figures, it is of course envisaged that such other elements are also included in the solar cell of the present disclosure.

In summary, the present disclosure provides an improved way of, in some instances, simultaneously, in e.g., a same processing step, both a) form a doped layer (e.g., a junction) on the rear side of a crystalline silicon bifacial solar cell, and b) to use the formed doped layer to smooth a pyramidal textured surface of the rear side in order to obtain sufficient surface passivation. The thickness of the epitaxial doped layer (and the corresponding angle of the epitaxial layer at the top of the pyramids) may be tailored to obtain both a high light generated current density (e.g., an optimal light generated current density in some instances) and a layer depth allowing for a sufficiently low doping level of the doped layer (junction) to limit Auger recombination losses.

Although features and elements are described above in particular combinations, each feature or element may be used alone without the other features and elements or in various combinations with or without other features and elements. The same applies to methods and individual method steps, which may be used alone or in combination also in other order if not explicitly indicated otherwise.

Additionally, variations to the disclosed embodiments can be understood and effected by the skilled person in practicing the claimed invention, from a study of the drawings, the disclosure, and the appended claims. Even if the inventive concept of the present disclosure has mainly been described with reference to a limited number of examples/embodiments, it is readily appreciated by the skilled person that other examples than the ones disclosed above are equally possible within the scope of the inventive concept, as defined by the appended claims.

In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

What is claimed is:

1. A method of forming a crystalline silicon bifacial solar cell, the method comprising:
   providing a silicon substrate comprising opposing major surfaces formed on a front side and a rear side;
   texturing at least the rear side of the silicon substrate to form a pyramidal topology comprising a plurality of pyramids formed on the major surface of the rear side; and
   epitaxially growing at least one doped silicon (Si) layer on the pyramids,
   wherein epitaxially growing comprises:
      evolving facets of at least some of the pyramids such that the at least one doped Si layer forms different crystallographic orientations while smoothing the pyramidal topology of the rear side, and
      growing until, on upper parts of a majority of the pyramids, an angle between a surface of the at least one doped Si layer and the major surface of the rear side is 5 to 35°.

2. The method of claim 1, wherein epitaxially growing is continued until the angle is 10 to 25°.

3. The method of claim 1, wherein epitaxially growing comprises growing until a thickness of the at least one doped Si layer is 1 to 2 µm.

4. The method of claim 1, wherein epitaxially growing comprises growing at a growth rate of 5 to 4000 nm/min.

5. The method of claim 1, wherein epitaxially growing comprises growing at a temperature of 700 to 1150° C.

6. The method of claim 1, wherein the epitaxially growing comprises using $SiH_2Cl_2$ as a silicon precursor, growing at a growth rate of 5 to 500 nm/min, and growing at a temperature of 700 to 1000° C.

7. The method of claim 1, wherein the epitaxially growing comprises using $SiHCl_3$ as a silicon precursor, growing at a growth rate of 200 to 4000 nm/min, and growing at a temperature of 900 to 1150° C.

8. The method of claim 1, wherein the epitaxially growing comprises using $SiH_4$ as a silicon precursor, growing at a growth rate of 200 to 4000 nm/min, and growing at a temperature of 900 to 1150° C.

9. The method of claim 1, wherein epitaxially growing comprises using $B_2H_6$, $BCl_3$, $AsH_3$, or $PH_3$ as a dopant precursor.

10. The method of claim 6, wherein a ratio of a flow rate of a dopant precursor to a flow rate of $SiH_2Cl_2$ is $10^{-5}$ to $10^{-2}$.

11. The method of claim 1, wherein texturing is such that a pyramid angle of the pyramids is at least 40°.

12. A crystalline silicon bifacial solar cell formed by the method of claim 1, the solar cell comprising:
   the silicon substrate having the front side and the rear side, wherein at least the rear side comprises the plurality of pyramids; and
   the at least one epitaxially grown doped silicon layer formed on the pyramids,
   wherein the doped silicon layer forms a surface that is smoother compared to an underlying surface formed by the pyramids, and
   wherein a pyramid angle of the pyramids is at least 40°.

13. The solar cell of claim 12, wherein the angle between the surface of the at least one doped Si layer and the substrate is 10 to 25°.

14. The solar cell of claim 12, wherein a thickness of the at least one doped Si layer is 1 to 2 µm.

15. The method of claim 2, wherein epitaxially growing is continued until the angle is 20° or 25°.

16. The method of claim 3, wherein the epitaxially growing is continued until a thickness of the at least one doped Si layer is 1.3 to 2.0 µm.

17. The method of claim 1, wherein evolving facets of the at least some of the pyramids is such that the at least one doped Si layer forms at least one facet having a crystallographic orientation that is different compared to facets of the pyramids prior to epitaxially growing the at least doped Si layer.

18. The solar cell of claim 13, wherein the angle between the surface of the at least one doped Si layer and the substrate is 20° or 25°.

19. The solar cell of claim 14, wherein a thickness of the at least one doped Si layer is 1.3 to 2.0 µm.

20. The solar cell of claim 12, wherein the doped silicon layer forms at least one facet having a crystallographic orientation that is different compared to facets of the pyramids underlying the silicon layer.

* * * * *